(12) United States Patent
Neelam et al.

(10) Patent No.: US 10,031,186 B2
(45) Date of Patent: Jul. 24, 2018

(54) SYSTEM FOR ASSURING SAFE OPERATION OF BATTERIES

(71) Applicant: HONEYWELL INTERNATIONAL INC., Morris Plains, NJ (US)

(72) Inventors: Jeevan Reddy Neelam, Bangalore (IN); Madasamy Shunmugavel, Bangalore (IN); Harmohan Singh, Rockaway Township, NJ (US); Hassan Ali Kojori, Mississauga (CA)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 352 days.

(21) Appl. No.: 14/950,116

(22) Filed: Nov. 24, 2015

(65) Prior Publication Data

US 2017/0146606 A1    May 25, 2017

(51) Int. Cl.
   *G01R 31/36*     (2006.01)
   *H02J 7/00*      (2006.01)

(52) U.S. Cl.
   CPC ..... *G01R 31/3624* (2013.01); *G01R 31/3679* (2013.01); *H02J 7/0031* (2013.01); *H02J 7/0047* (2013.01); *Y02T 50/54* (2013.01)

(58) Field of Classification Search
   CPC ............. G01R 31/3624; G01R 31/3679; H02J 7/0031; H02J 7/0047; Y02T 50/54
   See application file for complete search history.

(56) References Cited

U.S. PATENT DOCUMENTS 5,977,744 A * 11/1999 Williams .............. H02J 7/1423
                                                320/104
7,446,510 B2    11/2008 Chou et al.
(Continued)

FOREIGN PATENT DOCUMENTS

| EP | 0887654 A2 | 12/1998 |
| FR | 3009754 A1 | 2/2015 |
| WO | 2017050944 A1 | 3/2017 |

OTHER PUBLICATIONS

Hans-Georg Schweiger et al., Comparison of Several Methods for Determining the Internal Resistance of Lithium Ion Cells. Sensors, Oct. 2010, pp. 5604-5625.

(Continued)

*Primary Examiner* — Manuel L Barbee
(74) *Attorney, Agent, or Firm* — Shimokaji IP

(57) ABSTRACT

A system for assuring safe use of a battery pack includes a display unit and a state of health (SoH) monitor connected to the battery pack, the SoH monitor. The SoH monitor a) instructs the SoH monitor to measure terminal voltage of the battery pack at a beginning of a current flow cycle; b) instructs the SoH monitor to measure terminal voltage of the battery pack after completion of the current flow cycle; c) instructs the SoH monitor to successively re-measure terminal voltage of the battery pack after completion of the current flow cycle until one of the successively re-measured terminal voltages is equal to a previous one of the re-measured terminal voltage; d) instructs the SoH monitor to determine and record ampere-hours (Ah) passing through the battery pack during the time period between steps a) and c); e) instructs the SoH monitor to determine SoH of the battery pack as a function of a quotient of a difference between terminal voltages determined in steps a) and c) divided by the Ah determined in step d), and f) instructs the SoH monitor to send the SoH determined in step e) to the display unit for display as an updated SoH of the battery pack. A switch is operable to disconnect the battery pack from the DC power system upon the display unit indicating SoH of the battery pack being below a predetermined value.

13 Claims, 7 Drawing Sheets

(56) References Cited

U.S. PATENT DOCUMENTS

| | | |
|---|---|---|
| 8,560,257 B2 | 10/2013 | Tang et al. |
| 8,922,168 B2 | 12/2014 | Ko |
| 8,937,459 B2 | 1/2015 | Park et al. |
| 2009/0265125 A1* | 10/2009 | Zhang ............... H01M 10/4207 702/63 |
| 2011/0248680 A1* | 10/2011 | Timmons ............ H01M 2/1072 320/120 |
| 2013/0138369 A1* | 5/2013 | Papana .............. G01R 31/3644 702/63 |
| 2014/0167657 A1* | 6/2014 | Nishikawa .......... H01M 10/441 318/139 |
| 2014/0210399 A1 | 7/2014 | Urschel et al. |

OTHER PUBLICATIONS

Search Report and Office Action from EP application No. 16197443.1 dated Apr. 19, 2017.
Daniel Le and Xidong Tang, "Lithium-ion Battery State of Health Estimation Using Ah-V Characterization", Annual Conference of the Prognostics and Health Management Society, 2011, National Science Foundation & American Society for Engineering Education with Corporate Partnership from General Motors, Warren, MI 48090, USA.

\* cited by examiner

SYSTEM FOR ASSURING SAFE OPERATION OF BATTERIES

BACKGROUND OF THE INVENTION

The present invention relates generally to assuring safe and efficient operation of a battery. More particularly, the invention relates to a system for continually assuring that a battery has a satisfactory state of health (SoH) while the battery is installed in its operating environment A battery pack's SoH degrades with use and over time because individual cells in the battery pack lose their ability to store and deliver electrical energy with use and over time. But, the battery pack operating voltage range remains the same even with degradation in a battery's capacity. Thus, while a battery pack may appear ostensibly to be in satisfactory operational condition, the battery pack may, in fact, be on the verge of failure. In some instances such failure may produce problems beyond mere lack of performance of the battery pack. For example, because individual cells in the battery pack are not identical, the individual cells may degrade at a different rate with time and use. This may lead to a condition known as cell unbalance. A battery pack with degraded cells may still deliver a desired output. However, the degraded cell(s) may discharge or charge at a faster rate when compared with the other cells in the pack. Temperature of degraded cell(s) during operation may have more variance when compared with healthy cells and may lead to unsafe conditions such as thermal runaway.

Some battery packs are employed to deliver electrical power in applications where safety is of paramount importance. For example, numerous battery packs are used in modern "more electric aircraft" (MEA). To assure safe operation of such an aircraft, it would be desirable to provide a flight crew with a continuous report of the SOH and/or cell unbalance of battery packs on the aircraft so that the flight crew might take corrective action in the event of a report of a potential failure of a battery pack.

As can be seen, there is a need for system that enables safe use of battery packs in environments such as aircraft.

SUMMARY OF THE INVENTION

In one aspect of the present invention, a system for assuring safe use of a battery pack comprises: a switch connecting the battery pack to a DC power system; a display unit; a state of health (SoH) monitor connected to the battery pack, the SoH monitor including; a processor; and a memory block comprising a non-transitory computer-readable medium with instructions stored thereon, that when executed by the processor, performs the steps; a) instructs the SoH monitor to measure terminal voltage of the battery pack at a beginning of a current flow cycle; b) instructs the SoH monitor to measure terminal voltage of the battery pack after completion of the current flow cycle c) instructs the SoH monitor to successively re-measure terminal voltage of the battery pack after completion of the current flow cycle until one of the successively re-measured terminal voltages is equal to a previous one of the re-measured terminal voltage; d) instructs the SoH monitor to determine and record ampere-hours (Ah) passing through the battery pack during the time period between steps a) and c); e) instructs the SoH monitor to determine SoH of the battery pack as a function of a quotient of a difference between terminal voltages determined in steps a) and c) divided by the Ah determined in step d), and f) instructs the SoH monitor to send the SoH determined in step e) to the display unit for display as an updated SoH of the battery pack; wherein the switch is operable to disconnect the battery pack from the DC power system upon the display unit indicating SoH of the battery pack being below a predetermined value.

In another aspect of the present invention, apparatus for controlling electrical power distribution on an aircraft comprises. a starter motor for an engine of the aircraft; a DC power system connected to the starter motor; a battery pack; a first switch connecting the battery pack to the DC power system; a second switch for connecting the starter motor to an external power source; a state of heath (SoH) monitor connected to the battery pack; a display unit connected to the SoH monitor for displaying SoH of the battery pack; and a disconnect control unit configured to open the first switch and close the second switch in the event that displayed SoH of the battery pack is below a predetermined value.

In still another aspect of the present invention, a method for assuring safe use of a battery pack in a DC power system comprising the steps: determining terminal voltage change values for n cells of the battery pack during a current flow cycle; determining terminal voltage change value for the battery pack during the current flow cycle; dividing the battery pack voltage changes value by each of n cell voltage change values to develop terminal-voltage-change indices for the n cells; determining if the terminal-voltage-change indices for the n cells are equal; generating a cell-unbalance display in the event of inequality of any of the n terminal-voltage-change indices; disconnecting the battery pack from the DC power system in the event of said inequality.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features.

The present invention generally provides a system for assuring safe use of a battery pack. More particularly, the invention provides for monitoring and displaying of SoH while the battery pack is installed and operational to determine if continued use of the battery should be terminated. Still further, the invention provides for monitoring SoH of individual cells and cell unbalance of the battery pack to determine if the battery pack should be disconnected from a DC power system.

Figure 1:
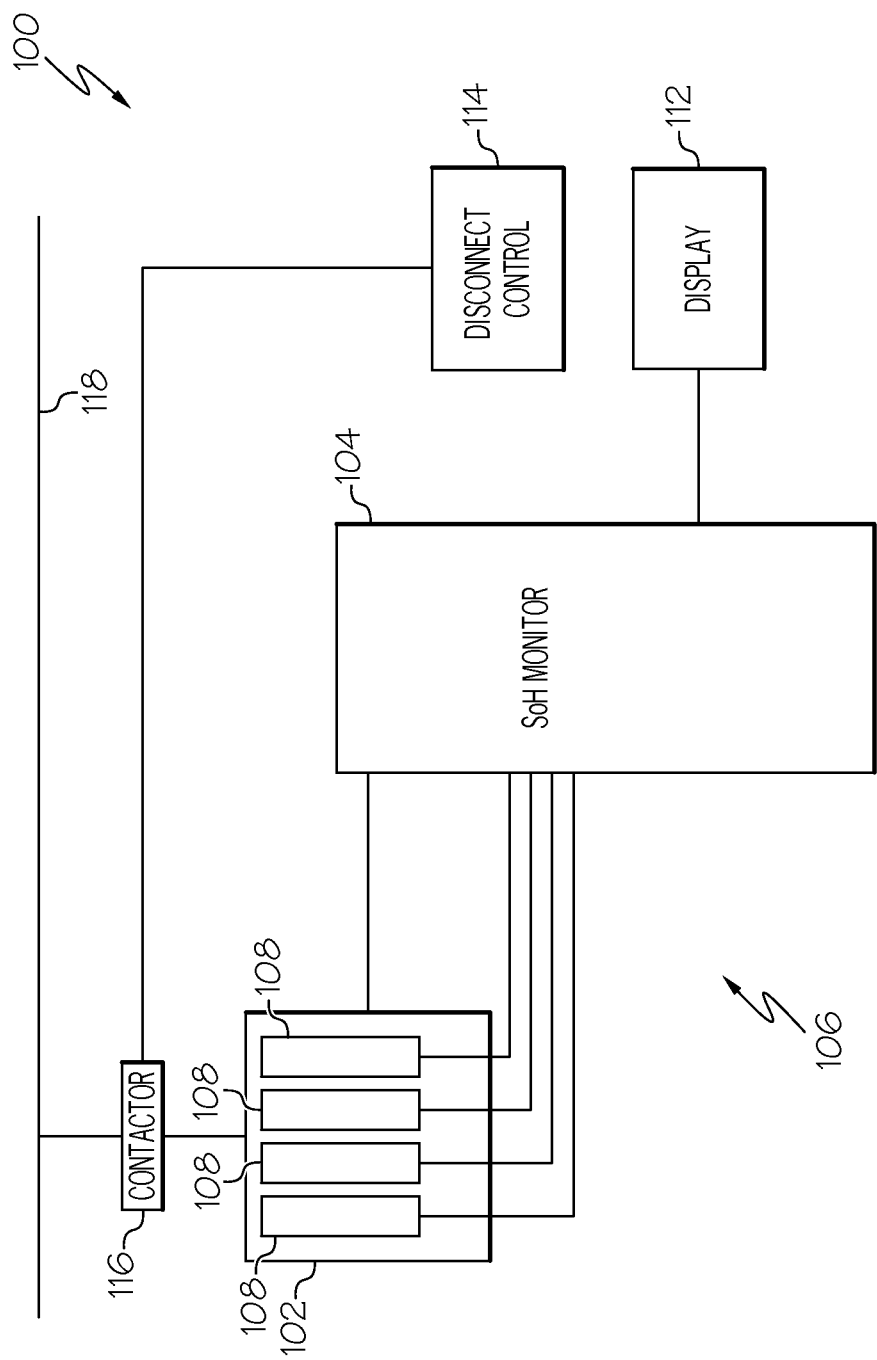
FIG. 1 is block diagram of a system for assuring safe use of a battery in accordance with an exemplary embodiment of the invention.

Referring now to FIG. 1, an exemplary embodiment of a safety-control system 100 for a battery pack 102 is illustrated. The control system 100 may include a state-of-health monitor 104 (hereinafter SoH monitor 104) coupled to the battery pack 102 and to individual cells 108 of the battery pack 102. A display unit 112 may be coupled to SoH monitor 104. A disconnect control 114 may be connected to operate a disconnect contactor or switch 116 to disconnect the battery pack 102 from a DC power system 118. If an unsafe condition within the battery pack 102 or the SoH of the battery pack 102 is below a predetermined value, the battery pack 102 may be disconnected from the DC power system 118.

Figure 1A:
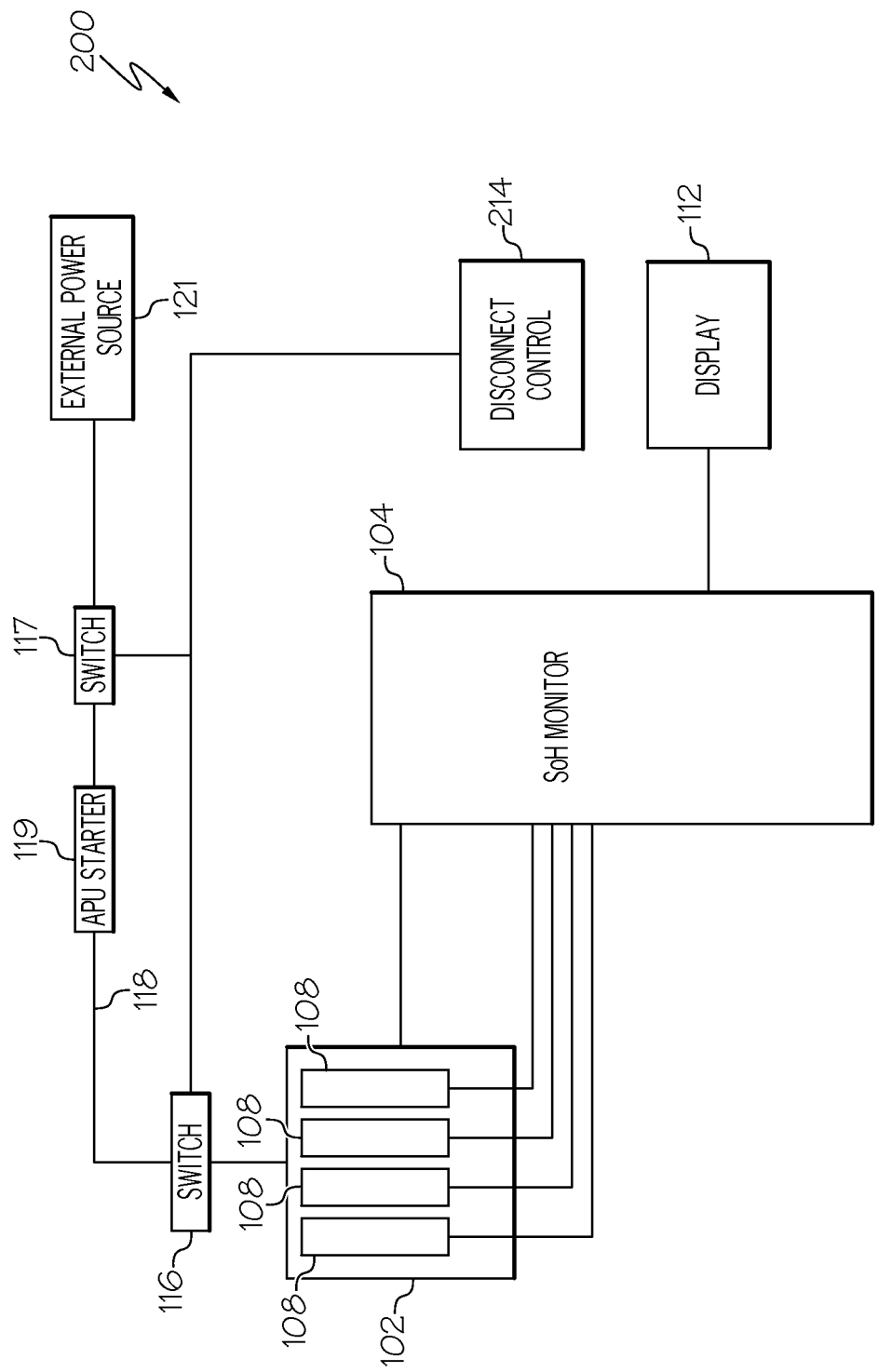
FIG. 1A is a block diagram of a system for assuring safe use of a battery in accordance with a second exemplary embodiment of the invention.

Referring now to FIG. 1A, an exemplary embodiment of battery-pack safety control system 200 is illustrated as it might be employed in an aircraft (not shown). The system 200 may differ from the system 100 in that a disconnect control 214 may be connected to operate both the switch 116 and a second switch 117. When the switch 116 is open and the switch 117 is closed, the battery pack 102 may be disconnected from a starter motor 119 of an engine (not shown) of an aircraft. The starter motor 119 may then be powered from an external power source 121 in the event that SoH of the battery pack 102 is lower than a predetermined value.

The system 200 may be useful in an aircraft that may be employed in short-haul operations. The flight crew may observe, from the display unit 112, that SoH of the battery pack 102 may be low, but still above a predetermined replacement limit. In that case, the flight crew may elect to use external power source 121 for driving a starter motor 119 of an auxiliary power unit (APU) of the aircraft instead of using the on-board battery pack 102 for such APU starting. In this manner, the flight crew may extend useful life of the battery pack 102 and avoid a need for a non-scheduled battery pack replacement. In other words, replacement of the low-SoH battery pack may be delayed until the aircraft is taken out of service for regularly scheduled maintenance.

Figure 2:
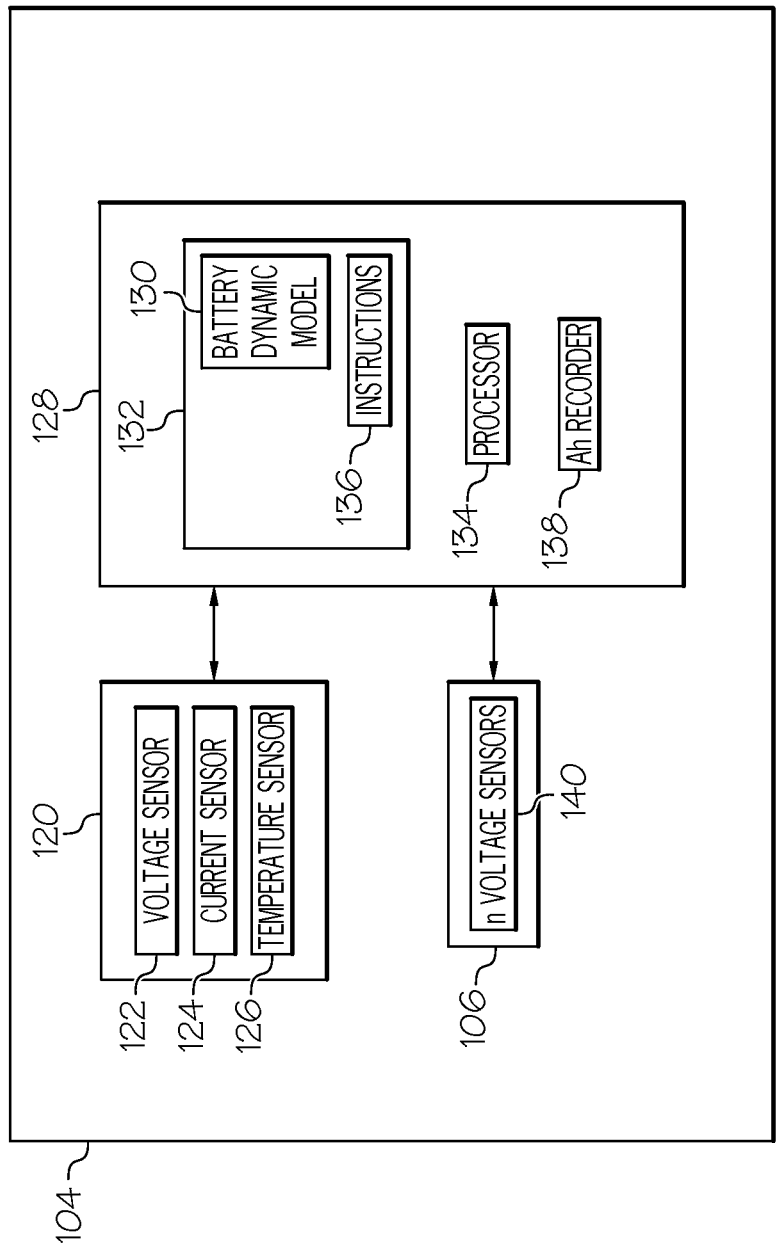
FIG. 2 is a block diagram of a state of health (SoH) monitor of the system of FIG. 1 in accordance with an exemplary embodiment of the invention.

Referring now to FIG. 2, a block diagram illustrates an exemplary embodiment of the SoH monitor 104. The SoH monitor 104 may include a measurement block 120 having a voltage sensor 122, a current sensor 124 and a temperature sensor 126. The measurement block 120 may be adapted to take on-line measurements from the battery pack 102. The SoH monitor 104 may also include a computer 128 with a non-volatile memory 132 and a processor 134.

Referring now to FIGS. 1 and 2, it may be seen that individual cells 108 of the battery pack 102 may be connected to the SoH monitor 104. More particularly, individual cells 108 may be connected to a cell measurement block 106 of the SoH monitor 104. The cell measurement block 106 may include a plurality, n, of voltage sensors 140 coupled individually to each of n cells 108.

In operation, the SoH monitor 104 may perform an SoH determination each time the battery pack 102 experiences completion of a cycle of current flow resulting from either charging or discharging. Such a cycle may include an initiation of current flow followed by a termination of the current flow. In some applications, the battery pack 102 may experience multiple cycles of current flow with relatively short time periods between cycles. For example, the battery pack 102 may provide power to a load for a period of five minutes and then after a lapse on only a few seconds the battery pack 102 may again provide power to a load for a five minute period. Such rapidly changing and repeating load powering may be considered to be a dynamic mode of operation.

Alternatively, the battery pack 102 may be installed in a vehicle such as an aircraft which may be parked at a terminal for a period of an hour or more, during which time the battery pack 102 may not be subjected to any cycles of current flow. In such a context, the battery pack 102 may be subjected to current flow cycles at intervals that may spaced apart in time by periods of hours. In other words, the current flow cycles may be separated in time by rest periods. Such a mode of operation may be referred to herein as a resting mode of operation.

The SoH monitor 104 may utilize a first SoH estimation technique for determining SoH for a cycle of current flow during a resting mode of operation of the battery pack 102. The SoH monitor 104 may utilize a second SoH estimation technique when a cycle of current flow occurs in the context of a dynamic mode of operation of the battery pack 102.

Figure 3:
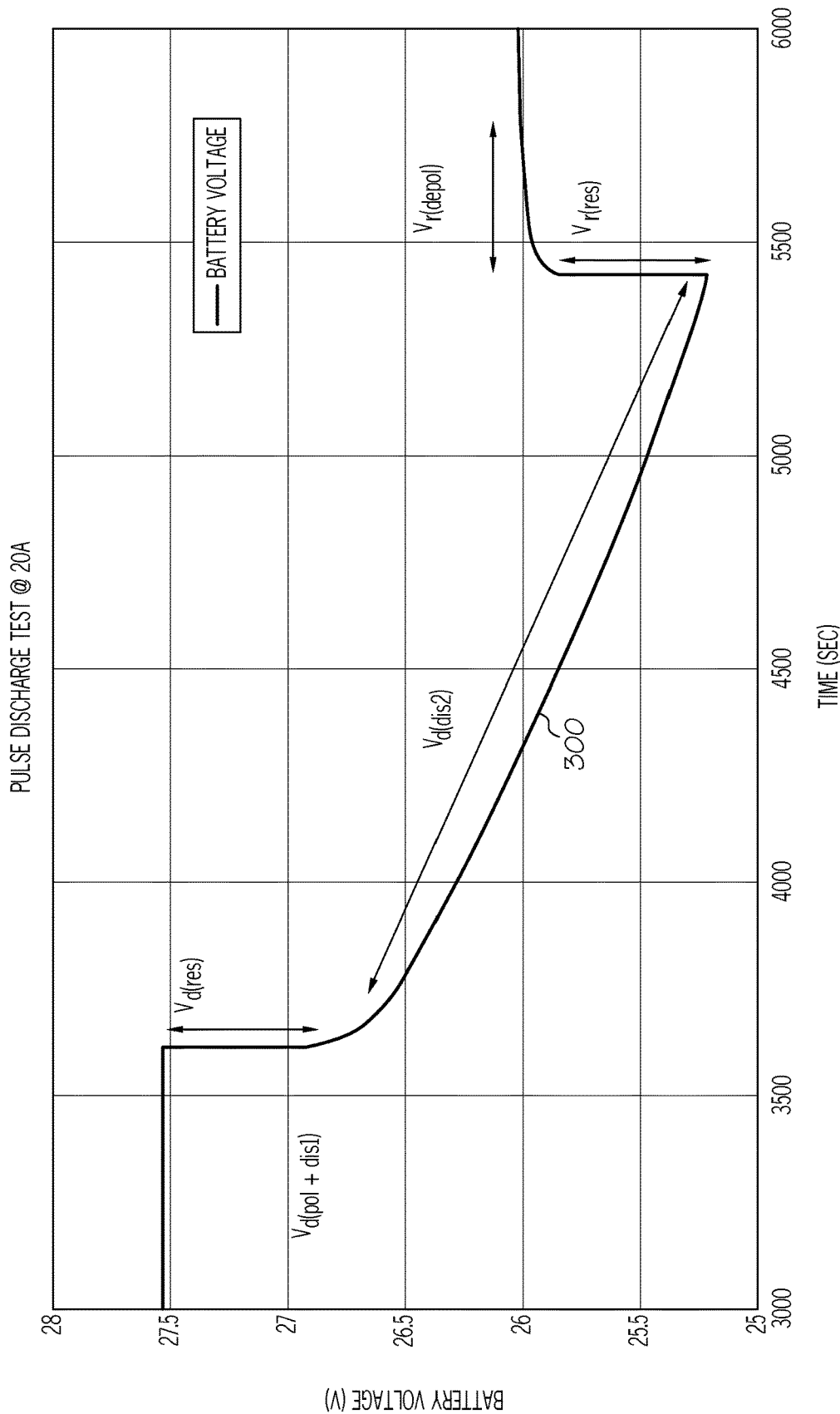
FIG. 3 is a plot of time versus battery voltage of a battery pack of the system of FIG. 1 in accordance with an exemplary embodiment of the invention.

Referring now to FIG. 3, a graph 300 illustrates a time versus battery voltage relationship for the battery pack 102 as it undergoes a cycle of current flow in a rested mode of operation. As the battery pack 102 discharges, changes in terminal voltage may be observed due to the following phenomena:

1. $V_{d(res)}$—Instantaneous drop in voltage due to series ohmic resistance at the start of discharge;
2. $V_{d(pol+dis1)}$—Drop in voltage due to combined effect of polarization and discharge phenomena;
3. $V_{d(dis2)}$—Drop in voltage due to discharge phenomenon only;
4. $V_{r(res)}$—Instantaneous rise in voltage due to series ohmic resistance at the end of discharge; and
5. $V_{r(depol)}$—Rise in voltage due to depolarization phenomenon during rest period.

The term "$V_{d(pol+dis1)}$" may be resolved into two components "$V_{d(pol)}$" and "$V_{d(dis1)}$". The components "$V_{d(pol)}$" may represent voltage drop due to polarization effect and "$V_{d(dis1)}$" may represent voltage drop due to charge delivering phenomenon during polarization period. Among the five phenomena listed above, only the "$V_{d(dis1)}$" and "$V_{d(dis2)}$" components represent terminal voltage lost due to charge delivering phenomenon. The other components are not associated with charge delivering phenomenon but still, they may affect a total change in terminal voltage.

Terminal voltage drop or gain per Ampere-Hour (Ah) delivered or received changes with battery health. Therefore, SoH function may be determined in accordance with the expression, $$SoH = f\left(\frac{\Delta V_{bat}}{Ah}\right) \quad (1)$$

In this context, SoH is most accurately determined if the term "$\Delta V_{bat}$" represents the change in terminal voltage due only to charge delivering phenomenon during discharge or charging operation. But, the total drop in terminal voltage during discharge operation is given by:

$$\Delta V_{bat(total)} = V_{d(res)} + V_{d(pol)} + (V_{d(dis1)} + V_{d(dis2)}) = \text{Total Voltage Drop} \quad (2)$$

where $V_{d(res)}$=Instantaneous drop in voltage due to series ohmic resistance;
$V_{d(pol)}$=Drop in voltage due to polarization effect; and
$V_{d(dis1)}+V_{d(dis2)}$=Drop in voltage due to charge delivering phenomenon As a practical matter, it may not be possible to separate and extract the voltage drop only due to charge delivering phenomenon (i.e. "$V_{d(dis1)}+V_{d(dis2)}$") in the above equation. Instead, the first two terms may be compensated for or cancelled out using rising voltage components that occur after discharge or charging operation.

There may be an instantaneous voltage rise "$V_{r(res)}$" in the battery terminal voltage at the end of discharge. This may be equal in magnitude and opposite in polarity to the instantaneous drop observed at the start of discharge operation. So, "$V_{r(res)}$" component can compensate "$V_{d(res)}$".

$$V_{r(res)} = -V_{d(res)} \quad (3)$$

Also, depolarization that occurs after the current flow cycle may compensate the polarization effect that occurs at a beginning of the current flow cycle. The battery pack 102 may get depolarized during a rest period to the same extent it is polarized during the current flow cycle, provided that the battery pack 102 is sufficiently rested after the current flow cycle. The voltage drop "$V_{d(pol)}$" due to polarization is equal to the voltage rise "$V_{r(depol)}$" during depolarization.

$$V_{r(depol)} = -V_{d(pol)} \quad (4)$$

Net change in terminal voltage during discharge operation is given by, $$\Delta V_{bat} = V_{d(res)} + V_{d(pol)} + (V_{d(dis1)} + V_{d(dis2)}) + V_{r(res)} + V_{r(depol)} \quad (5)$$

Thus $$SoH = \quad (6)$$
$$f\left(\frac{\Delta V_{bat}}{Ah}\right) = f\left(\frac{V_{d(res)} + V_{d(pol)} + V_{d(dis1)} + V_{d(dis2)} + V_{r(res)} + V_{r(depol)}}{Ah}\right)$$

Using eq. (3) and (4), rewriting eq. (6), $$SoH = f\left(\frac{\Delta V_{bat}}{Ah}\right) = f\left(\frac{V_{d(dis1)} + V_{d(dis2)}}{Ah}\right) \quad (7)$$

It may be noted that accuracy of the rested-mode estimation technique described above may be dependent upon the occurrence of a sufficiently long rest period between successive current flow cycles. As explained hereinbelow and illustrated in FIG. 5, such sufficiency of length of a rest period may be determined to exist when successive measurements of $V_{r(depol)}$ (See FIG. 3) at an end of a current flow cycle are equal to one another.

Figure 4:
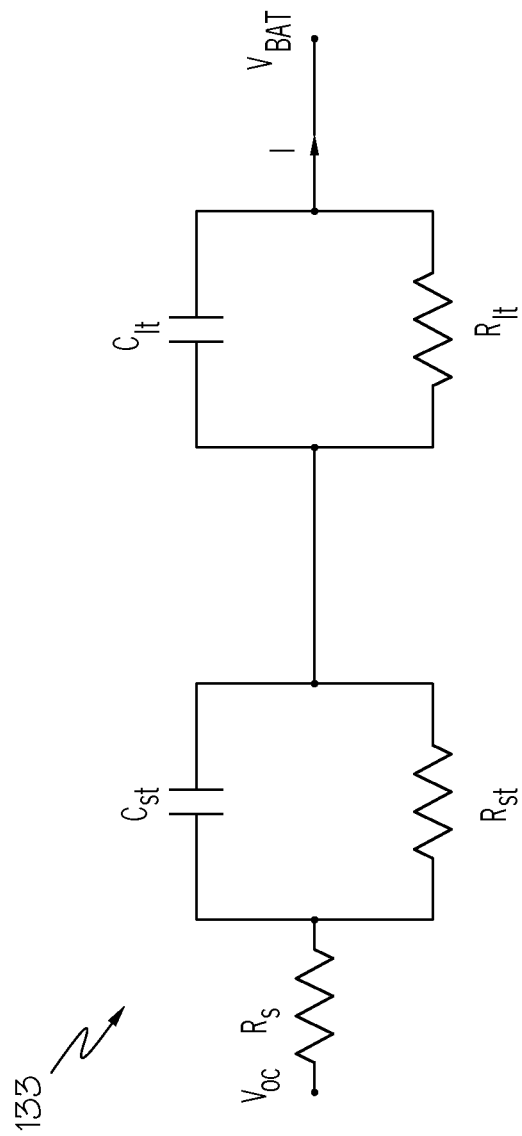
FIG. 4 is an electrical equivalent 2-RC model of the battery pack of the system of FIG. 1 in accordance with an exemplary embodiment of the invention.

If the battery pack 102 is operated with only insufficient rest periods between successive current flow cycles, the second or dynamic-mode estimation technique may be performed. This dynamic-mode estimation may be performed in a manner similar to that described in US Patent Application Publication 2013/0138369, which publication is incorporated herein by reference in its entirety. In the dynamic-mode estimation technique, the computer 128 may employ a battery dynamic model 130 stored in the non-volatile memory 132. The battery dynamic model 130 may include various values of parameters $R_s$, $C_{st}$, $R_{st}$, $C_{lt}$ and $R_{lt}$ determined at various temperatures, terminal voltages and currents while the battery pack 102 is off line. The parameters may be elements of a battery model 133 illustrated in FIG. 4.

The computer 128 may include a processor 134 adapted to receive the on-line measurements from the measurement block 120 and to calculate an open circuit voltage online, using an equation $$V_{OC} = V_{BAT} + \Delta V_R + \Delta V_P \quad (8)$$

where
$V_{BAT}$=Battery terminal voltage;
$\Delta V_R$=Voltage drop due to battery resistance;
$\Delta V_P$—Voltage drop due to polarization phenomenon; and
wherein $\Delta V_P$ is computed using an equation $$\Delta V_P = I * \left[\left(\frac{R_{st}}{1+(R_{st} \cdot C_{st})s}\right) + \left(\frac{R_{lt}}{1+(R_{lt} \cdot C_{lt})s}\right)\right] \quad (9)$$

in which values of $R_s$, $C_{st}$, $R_{st}$, $C_{lt}$ and $R_{lt}$ are determined from the battery dynamic model 130 by comparing the on-line measurements to the battery dynamic model 130.

Accuracy of a resultant calculation of Voc may be enhanced by recursive application of mathematical filtering within the processor 134. In an exemplary embodiment of the invention the following adaptive filter equations may be employed:

State Estimate Equation (Time Update:

$$\begin{bmatrix} SoC_{(k)} \\ V_{ST(k)} \\ V_{LT(k)} \end{bmatrix} = \begin{bmatrix} 1 & 0 & 0 \\ 0 & 1-\left(\frac{dt}{R_{ST(k-1)} * C_{ST(k-1)}}\right) & 0 \\ 0 & 0 & 1-\left(\frac{dt}{R_{LT(k-1)} * C_{LT(k-1)}}\right) \end{bmatrix} \begin{bmatrix} SoC_{(k-1)} \\ V_{ST(k-1)} \\ V_{LT(k-1)} \end{bmatrix} + \begin{bmatrix} \frac{-dt}{Q} \\ \frac{dt}{C_{ST(k-1)}} \\ \frac{dt}{C_{LT(k-1)}} \end{bmatrix} [I_{Bat(k)}] \ldots \quad (10)$$

$$V_{OC(k)}^- = V_{OC}(SoC_{(k)}^-) \quad (11)$$

Output Equation $$V_{Bat(k)} = V_{OC}(SoC_{(k)}^-) - V_{ST(k)}^- - V_{LT(k)}^- - [I_{Bat(k)} * R_{ser}] \quad (12)$$

State Correction Equation (Measurement Update):

$$\begin{bmatrix} SoC_{(k)}^+ \\ V_{ST(k)}^+ \\ V_{LT(k)}^+ \end{bmatrix} = \begin{bmatrix} SoC_{(k)}^- \\ V_{ST(k)}^- \\ V_{LT(k)}^- \end{bmatrix} + L_k[V_{Bat(mes)} - V_{Bat(k)}] \quad (13)$$

$$V_{OC(k)}^+ = V_{OC}(SoC_{(k)}^+) \quad (14)$$

Where:
$R_{ser}$ is ohmic resistance of the battery pack;
Q is the full capacity of the battery;

$L_k$ is the filter gain matrix; and
$V_{Bat(mes)}$ is the measured battery voltage.

SoH of the battery pack 102 may then be determined in the manner described in US Patent Application Publication 2013/0138369 by employing the value of Voc determined in accordance with the dynamic-mode estimation technique described above.

Figure 5:
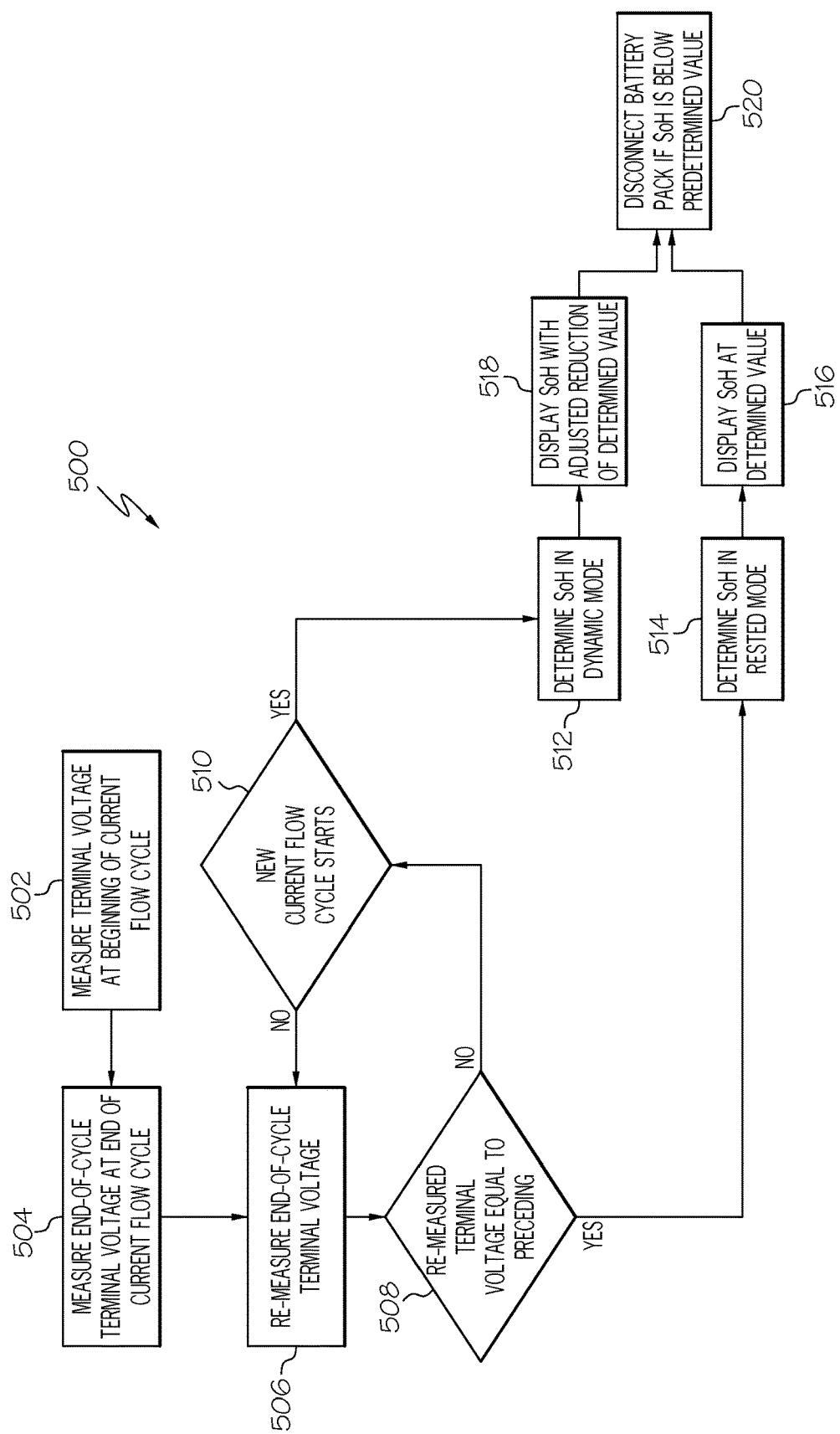
FIG. 5 is a flow chart of a method for assuring safe use of a battery pack in accordance with an exemplary embodiment of the invention.

Referring now to FIG. 5, a flow chart illustrates an exemplary embodiment of a method 500 for assuring safe use of a battery pack. The method 500 may employ either or both of the rested-mode SoH estimation technique and the dynamic-mode SoH estimation technique. In a step 502, terminal voltage of the battery pack may be measured at a beginning of a current flow cycle (e.g. the terminal voltage may be measured by the voltage sensor 122 of the SoH monitor 104). In a step 504, an end-of-cycle terminal voltage of the battery pack may be measured at an end of the current flow cycle (e.g. $V_{r(depol)}$ of FIG. 3 may be measured by the voltage sensor 122). In a step 508, the end-of-cycle terminal voltage may be re-measured (e.g. $V_{r(depol)}$ of FIG. 3 may be re-measured by the voltage sensor 122). In a step 510. the end-of cycle terminal voltage of step 506 may be compared to the end-of-cycle terminal voltage of step 506. If the measured voltage of step 508 is unequal to the measured voltage of step 506, the steps 506 and 508 may be successively repeated until the voltages of steps 504 and 506 are found to be equal. Equality of voltage measurements of steps 506 and 508 may be indicative of passage of sufficient time to assure that the rested-mode of estimation may be properly employed.

In a step 510, a determination may be made as to whether a new current flow cycle has begun prior to achieving re-measured terminal voltage equality in step 508. In that event SoH of the battery pack may be estimated in step 512 in accordance with the dynamic-mode of SoH estimation. If, in step 508, end-of-cycle terminal voltage of steps 504 and 506 are found to be equal, then SoH of the battery pack may be estimated in step 514 in accordance with the rested-mode of SoH estimation.

If step 514 is performed, then in a step 516, rested-mode SoH estimations may be displayed at the nominal value determined in step 514. If step 516 is performed, then in a step 518, a dynamic mode estimation of SoH may be displayed with an adjusted value of the actual SoH determined in step 512. Rested-mode estimations may have a higher likelihood of being accurate as compared to dynamic-mode SoH estimations. Thus, the dynamic-mode SoH estimation may be adjusted to account for a potential margin of error. For example, a adjusted dynamic-mode SoH value may be about 0.01% to about 0.015% lower than a nominal SoH value determined by the rested-mode estimation technique. In a step 520, the battery pack may be disconnected from a DC power system if SoH of the battery pack is below a predetermined value.

Figure 6:
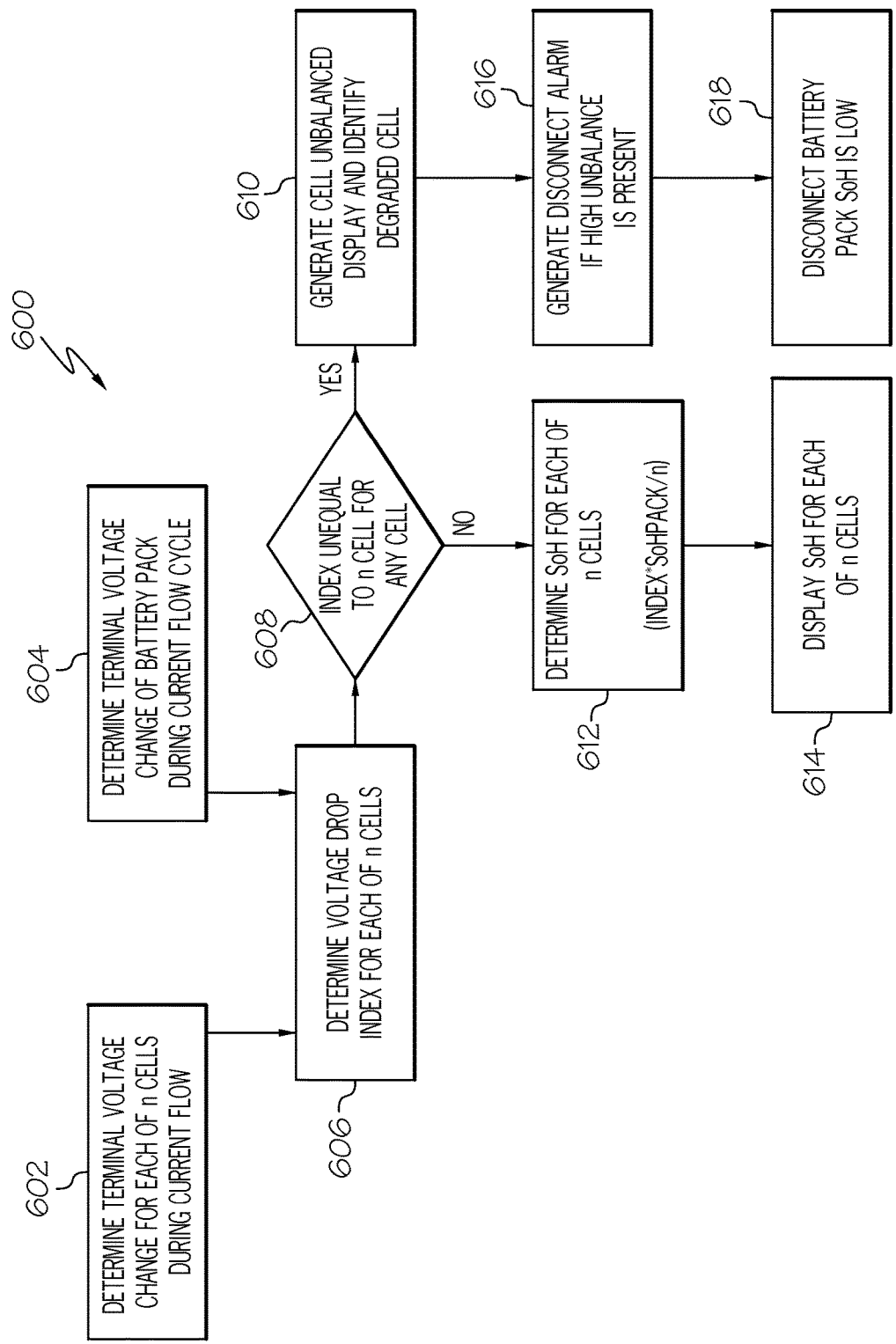
FIG. 6 is a flow chart of a method for assuring safe use of a battery pack in accordance with another exemplary embodiment of the invention.

Referring now to FIG. 6, a flow chart illustrates another exemplary method 600 for assuring safe use of a battery. The method 600 may differ from the method 500 in that cell unbalance and SoH values of individual cells of the battery are monitored and displayed. In a step 602, terminal voltage change for each of n cells may be determined during a current flow cycle (e.g., terminal voltage change may be measured with the n voltage sensors 140 of the cell measurement block 106). A step 604 may be performed simultaneously with step 602. In the step 604, terminal voltage change for the battery pack may be determined during the current flow cycle (e.g., terminal voltage change may be measured with the voltage sensor 122 of the measurement block 120 during the same current flow cycle for which terminal voltage change is measured in step 602).

In a step 606, the voltage changes measured in steps 602 and 604 may be combined to develop a terminal-voltage-change index for each of the n cells in accordance with the expression:

$$\Delta V_{index(cn)} = \frac{\Delta V_{pack}}{\Delta V_{cn}} \qquad (15)$$

In a step 608, a determination may be made as to whether the terminal-voltage-change indices for all the n cells are equal. In a step 610, a cell-unbalance display may be generated in the event of inequality of any of the n terminal-voltage-change indices. In the step 610, the identity of one or more degraded cells may also be displayed. SoH for each of the n cells may be determined in accordance with the expression;

$$SoH_{cn} = \Delta V_{index(cn)} \times \frac{SoH_{pack}}{n} \qquad (16)$$

In a step 614, SoH for each of the n cells may be displayed (e.g., the display unit 112 of FIG. 1 may be employed to display the SoH information from step 614). In step 616, a disconnect alarm may be generated if a high unbalance is present (e.g., the display unit may provide a high unbalance display if cell unbalance exceeds about 0.1 volts to about 0.15 volts). In that event, a step 618 may be performed in which the battery pack may be disconnected from a DC power system.

Referring back to FIG. 1, it may be seen that with such a collection of battery-related information on the display unit 112, an observer of the display unit 112 may have an opportunity to make a real-time decision as to whether or not to allow the battery to continue performing its role. Consider, for example, the battery pack 102 being installed in an aircraft. The flight crew might elect to operate the disconnect control 114 if the display unit 112 showed that a cell unbalance condition exceeding about 0.1 to about 0.15 volts had developed. The battery pack 102 would then be disconnected from the DC power system 118 and a risk of overheating of the battery pack 102 might be precluded.

It should be understood, of course, that the foregoing relates to exemplary embodiments of the invention and that modifications may be made without departing from the spirit and scope of the invention as set forth in the following claims.

We claim:
1. A system for assuring safe use of a battery pack comprising:
   a switch connecting the battery pack to a DC power system;
   a state of health (SoH) monitor connected to the battery pack, the SoH monitor including:
   a processor; and
   a memory block comprising a non-transitory computer-readable medium with instructions stored thereon, that when executed by the processor, performs the steps of:
   a) instructs the SoH monitor to measure terminal voltage of the battery pack at a beginning of a current flow cycle;

b) instructs the SoH monitor to measure terminal voltage of the battery pack after completion of the current flow cycle;

c) instructs the SoH monitor to successively re-measure terminal voltage of the battery pack after completion of the current flow cycle until one of the successively re-measured terminal voltages is equal to a previous one of the re-measured terminal voltage;

d) instructs the SoH monitor to determine and record ampere-hours (Ah) passing through the battery pack during the time period between steps a) and c); and e) instructs the SoH monitor to determine SoH of the battery pack as a function of a quotient of a difference between terminal voltages determined in steps a) and c) divided by the Ah determined in step d);

wherein the switch is operable to disconnect the battery pack from the DC power system upon a display unit indicating SoH of the battery pack being below a predetermined value.

2. The system of claim 1:

wherein the non-transitory memory includes a battery dynamic model with various values of parameters $R_s$, $C_{st}$, $R_{st}$, $C_{lt}$ and $R_{lt}$ determined at various temperatures, terminal voltages and currents while the battery pack is off line, the parameters being elements of a battery model that includes:

a resistance $R_s$ in series with a first and a second RC branch;

the first RC branch representing a polarization phenomenon for a short time just after keeping the model battery in rest;

the first RC branch including a capacitor $C_{st}$ connected in parallel with a resistor $R_{st}$;

the second RC branch representing the polarization phenomenon for a long time just after keeping the model battery in rest;

the second RC branch including a capacitor $C_{lt}$ connected in parallel with a resistor $R_{lt}$; and wherein the non-transitory computer-readable medium includes instructions to determine SoH as a function of an open circuit voltage (Voc) estimation based on the battery dynamic model and measurements made by the SoH monitor.

3. The system of claim 2 wherein the non-transitory computer-readable medium includes instructions to determine SoH as a function of Voc only if the battery pack experiences a second current flow cycle prior to completion of step c).

4. The system of claim 3 wherein the non-transitory computer-readable medium includes instructions to determine SoH on the basis of estimated Voc.

5. The system of claim 4 wherein the non-transitory computer-readable medium includes instructions to determine SoH on the basis of estimated Voc at an adjusted SoH value lower than an actual value of SoH determined on the basis of estimated Voc.

6. The system of claim 5 wherein the adjusted SoH value is about 0.01% to about 0.015% lower than the actual SoH value.

7. The system of claim 1 wherein the non-transitory computer-readable medium includes further instructions to: determine terminal voltage change for each of n cells of the battery pack during the current flow cycle, and generate a cell-unbalance signal if there are any differences among the terminal voltage changes of the n cells.

8. The system of claim 7 wherein the non-transitory computer-readable medium includes further instructions to produce a disconnect alarm if cell-unbalance of any of the n cells exceeds about 0.1 to about 0.15 volts.

9. Apparatus for controlling electrical power distribution on an aircraft comprising:

a starter motor for an engine of the aircraft;

a DC power system connected to the starter motor;

a battery pack;

a first switch connecting the battery pack to the DC power system;

a second switch for connecting the starter motor to an external power source;

a state of heath (SoH) monitor connected to the battery pack;

a display unit connected to the SoH monitor for displaying SoH of the battery pack; and a disconnect control unit configured to open the first switch and close the second switch in the event that the displayed SoH of the battery pack is below a predetermined value.

10. The apparatus of claim 9 wherein the SoH monitor includes:

a processor; and a memory block comprising a non-transitory computer-readable medium with instructions stored thereon, that when executed by the processor, performs the steps of:

a) instructs the SoH monitor to measure terminal voltage of the battery pack at a beginning of a current flow cycle;

b) instructs the SoH monitor to measure terminal voltage of the battery pack after completion of the current flow cycle;

c) instructs the SoH monitor to successively re-measure terminal voltage of the battery pack after completion of the current flow cycle until one of the successively re-measured terminal voltages is equal to a previous one of the re-measured terminal voltage;

d) instructs the SoH monitor to determine ampere-hours (Ah) passing through the battery pack during the time period between steps a) and c); and e) instructs the SoH monitor to determine SoH of the battery pack as a function of a quotient of a difference between terminal voltages determined in steps a) and c) divided by the Ah determined in step d).

11. The apparatus of claim 10 wherein the non-transitory computer-readable medium includes instructions to determine SoH as a function of an open circuit voltage (Voc) estimation based on a battery dynamic model if the battery pack experiences a second current flow cycle prior to completion of step c).

12. The apparatus of claim 11 wherein the non-transitory computer-readable medium includes instructions to display SoH determined on the basis of estimated Voc at an adjusted SoH value lower than an actual value of SoH determined on the basis estimated Voc.

13. The apparatus of claim 12 wherein the adjusted SoH value is about 0.01% to about 0.015% lower than the actual SoH value.

* * * * *